United States Patent
La Porta et al.

(10) Patent No.: US 9,179,584 B2
(45) Date of Patent: Nov. 3, 2015

(54) METHOD OF ASSEMBLING AN ELECTRO-OPTICAL DEVICE

(75) Inventors: Antonio La Porta, Kilchberg (CH);
Bert J. Offrein, Schoenenberg (CH);
Ibrahim Murat Soganci, Zurich (CH)

(73) Assignee: International Business Machines Corporation, Armonk, NY (US)

( * ) Notice: Subject to any disclaimer, the term of this patent is extended or adjusted under 35 U.S.C. 154(b) by 168 days.

(21) Appl. No.: 13/569,297

(22) Filed: Aug. 8, 2012

(65) Prior Publication Data

US 2014/0026394 A1  Jan. 30, 2014

Related U.S. Application Data

(63) Continuation of application No. 13/557,730, filed on Jul. 25, 2012, now Pat. No. 9,036,952.

(51) Int. Cl.
*H05K 3/30* (2006.01)
*H05K 13/00* (2006.01)
*G02B 6/42* (2006.01)

(52) U.S. Cl.
CPC *H05K 13/00* (2013.01); *G02B 6/42* (2013.01); *G02B 6/428* (2013.01); *G02B 6/4204* (2013.01); *G02B 6/4214* (2013.01); *G02B 6/4249* (2013.01); *Y10T 29/49002* (2015.01); *Y10T 29/49194* (2015.01)

(58) Field of Classification Search
CPC .......... Y10T 29/49007; Y10T 29/49016; Y10T 29/49018; Y10T 29/49128; Y10T 29/4913; Y10T 29/49139; Y10T 29/49155; Y10T 29/49169; Y10T 29/49904; G02B 6/42; G02B 6/428; H05K 13/00
USPC .......... 29/592.1, 593, 602.1, 833, 835; 356/124, 125, 127, 512, 515
See application file for complete search history.

(56) References Cited

U.S. PATENT DOCUMENTS

| | | | |
|---|---|---|---|
| 6,512,861 | B2 | 1/2003 | Chakravorty et al. |
| 6,690,845 | B1 | 2/2004 | Yoshimura et al. |
| 6,952,514 | B2 | 10/2005 | Lee et al. |
| 6,970,612 | B2 | 11/2005 | Ouchi |

(Continued)

FOREIGN PATENT DOCUMENTS

WO   WO2011104317 A1   9/2011

OTHER PUBLICATIONS

A. Mekis, et al., "A Grating-Coupler-Enabled CMOS Photonics Platform," IEEE Journal of Selected Topics in Quantum Electronics, vol. 17., No. 3, May/Jun. 2011; pp. 597-608.

(Continued)

*Primary Examiner* — Paul D Kim
(74) *Attorney, Agent, or Firm* — Cantor Colburn LLP; Daniel Morris

(57) ABSTRACT

A method of assembling an electro-optical device is disclosed. A first unit of the electro-optical device is positioned with respect to a second unit of the electro-optical device to pre-align an optical communication pathway between the first unit and the second unit. The first unit is positioned with respect to the second unit to pre-align an electrical communication pathway between the first unit and the second unit. The first unit is bonded to the second unit to assemble the electro-optical device to establish optical communication and electrical communication between the first unit and the second unit.

11 Claims, 3 Drawing Sheets

(56) References Cited

U.S. PATENT DOCUMENTS

| | | | |
|---|---|---|---|
| 7,058,247 B2* | 6/2006 | Crow et al. | 385/14 |
| 7,523,852 B2* | 4/2009 | Buchwalter et al. | 228/246 |
| 7,643,710 B1 | 1/2010 | Liu | |
| 7,650,052 B2 | 1/2010 | Krishnamoorthy et al. | |
| 7,684,660 B2 | 3/2010 | Braunisch et al. | |
| 8,009,992 B2* | 8/2011 | Williams | 398/131 |
| 8,041,157 B2 | 10/2011 | Foster et al. | |
| 2006/0067609 A1 | 3/2006 | Lu et al. | |
| 2010/0006784 A1 | 1/2010 | Mack et al. | |
| 2010/0215317 A1 | 8/2010 | Rolston et al. | |
| 2011/0044367 A1 | 2/2011 | Budd et al. | |
| 2011/0142396 A1 | 6/2011 | Okamoto | |
| 2012/0057610 A1 | 3/2012 | Dallesasse et al. | |

OTHER PUBLICATIONS

F.E. Doany, et al., "160 Gb/s Bidirectional Polymer-Waveguide Board-Level Optical Interconnects Using CMOS-Based Transceivers," IEEE Transactions Advanced Packaging, vol. 32., No. 2., May 2009; pp. 345-359.

C. Kopp, et al., "Silicon Photonic Circuits: On-CMOS Integration, Fiber Optical Coupling, and Packaging," IEEE Journal of Selected Topics in Quantum Electronics, vol. 17., No. 3., May/Jun. 2011; pp. 498-509.

K. Ohashi, et al., "On-Chip Optical Interconnect," Proceedings of the IEEE; Issue Date: Jul. 2009; vol. 97, Issue: 7; pp. 1186-1198.

P. Pepeljugoski, et al., "Low Power and High Density Optical Interconnects for Future Supercomputers," OthX2.pdf; IEEE OSA/OFC/NFOEC 2010; pp. 1-3.

C.L. Schow, et al., "A Single-Chip CMOS-Based Parallel Optical Transceiver Capable of 240-Gb/s Bidirectional Data Rates," IEEE Journal of Lightwave Technology, vol. 27., No. 7., Apr. 1, 2009; pp. 915-929.

H.D. Thacker, et al., "Flip-Chip Integrated Silicon Photonic Bridge Chips for Sub-Picojoule Per Bit Optical Links," 2010 IEEE; 2010 Electronic Components and Technology Conference; pp. 240-246.

* cited by examiner

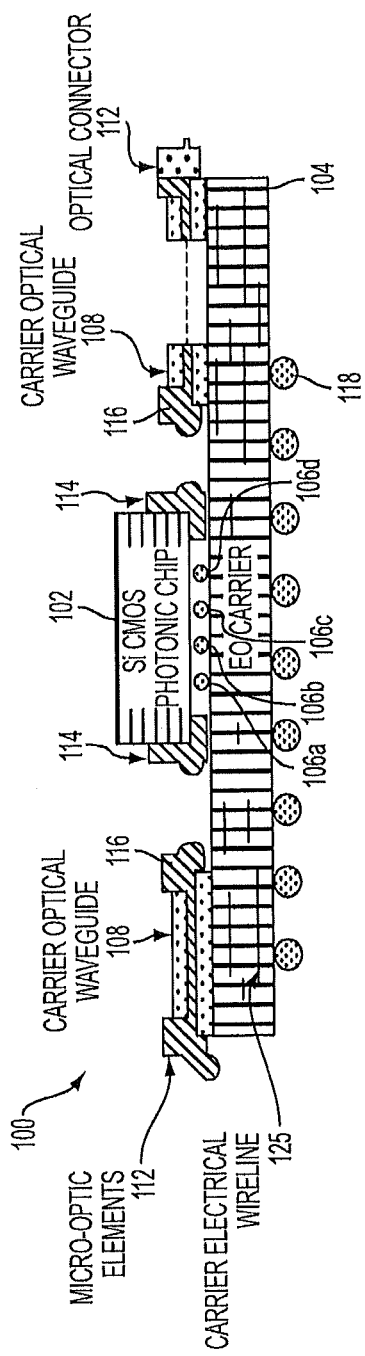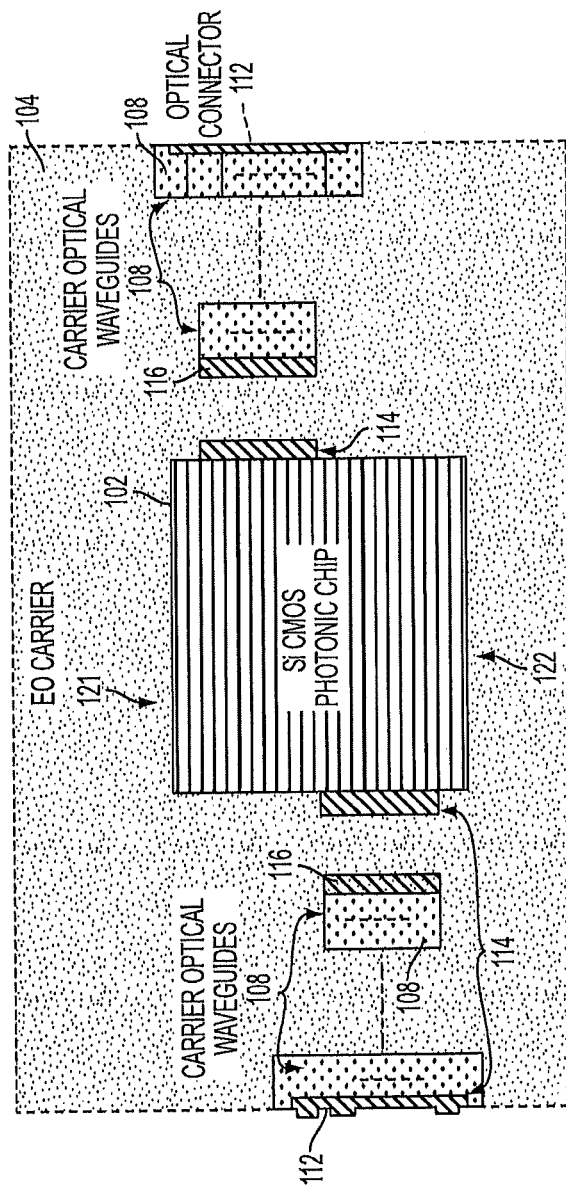

METHOD OF ASSEMBLING AN ELECTRO-OPTICAL DEVICE

This application is a Continuation of U.S. Non-Provisional application Ser. No. 13/557,730, entitled "ELECTRO-OPTICAL ASSEMBLY FOR SILICON PHOTONIC CHIP AND ELECTRO-OPTICAL CARRIER", filed on Jul. 25, 2012, now U.S. Pat. No. 9,036,952, which is incorporated herein by reference in its entirety.

BACKGROUND

The present invention relates generally to electro-optical packaging and, more specifically, to providing electrical and optical coupling between a silicon photonic chip and an electro-optical carrier.

In computing systems, one or more processors may exchange data among themselves at rates as high as several Terabits per second (Tbit/s) with a projected bandwidth of hundreds of Tbit/s. Integration of photonics with electronics is key to achieving this projected bandwidth. Silicon photonics has been introduced into Complementary Metal-Oxide Semiconductor (CMOS) technology to allow simultaneously manufacture of electronic and optical components on a single integrated chip. In addition, various optical components have been demonstrated to enable optical signal coupling between a silicon photonic chip and a standard optical fiber. As bandwidth increases, the complexity of electro-optical packages that support the projected bandwidth and the number of assembly steps of such electro-optic packages increases.

SUMMARY

According to one embodiment, a method of assembling an electro-optical device includes: positioning a first unit of the electro-optical device with respect to a second unit of the electro-optical device to pre-align an optical communication pathway between the first unit and the second unit; positioning the first unit with respect to the second unit to pre-align an electrical communication pathway between the first unit and the second unit; and bonding the first unit to the second unit to assemble the electro-optical device to establish optical communication and electrical communication between the first unit and the second unit.

According to another embodiment, an electro-optical device includes: a first unit having an optical coupling element and an electrical coupling element; and a second unit having an optical coupling element and an electrical coupling element; wherein an electrical bond between the first unit and the second unit establishes an electrical communication pathway between the first unit and the second unit and aligns an optical communication pathway between the first unit and the second unit.

According to another embodiment, a method of assembling an electro-optical device includes: pre-aligning an optical coupling element of a silicon photonic chip with an optical coupling element of an electro-optical carrier; pre-aligning an electrical coupling element of the silicon photonic chip with an electrical coupling element of the electro-optical carrier; and forming an electrical bond of the silicon photonic chip with the electro-optical carrier to assemble the electro-optical device.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The foregoing and other features, and advantages of the invention are apparent from the following detailed description taken in conjunction with the accompanying drawings in which:

FIG. 1 shows a cross-sectional view of an electro-optical assembly in an exemplary embodiment;

FIG. 2 shows a top view of the exemplary electro-optical assembly of FIG. 1;

DETAILED DESCRIPTION

Figure 3:
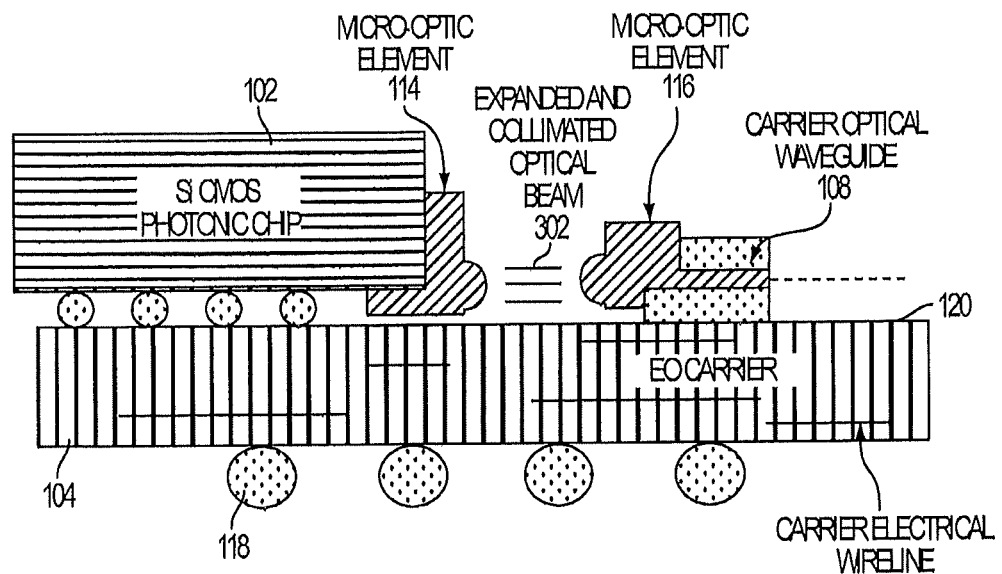
FIG. 3 shows an optical coupling between a silicon photonic chip and an electro-optical carrier in an exemplary embodiment.

FIG. 1 shows a cross-sectional view of an electro-optical assembly 100 in an exemplary embodiment. The electro-optical assembly 100, also referred to herein as an electro-optical device, includes a first unit 102 for electrical and optical signal processing and a second unit 104 for transport of electrical and optical signals to and from the first unit 102. The first unit may include one or more electro-optical chips. In an exemplary embodiment, the first unit 102 may be a silicon photonic chip. In an exemplary embodiment, the second unit may be an electro-optical carrier. For illustrative purposes only, the electro-optical assembly is discussed with respect to a silicon photonic chip 102 and an electro-optical carrier 104. An exemplary silicon photonic chip 102 may be Silicon Complementary Metal-Oxide Semiconductor (Si-CMOS) that may include electrical components and optical components integrated on the chip. The silicon photonic chip 102 may be configured for both electrical signal processing and optical signal processing as well as for conversion between optical and electrical signals. The optical elements of the silicon photonic chip 102 may be configured to perform one or more optical functions, such as, but not limited to, beam guiding, beam splitting, beam combination, optical signal modulation, receiving optical signals and optical signal processing. In addition, the silicon photonic chip 102 may include one or more optical coupling elements 114 for providing optical signal input and output at the silicon photonic chip 102. Optical coupling elements 114 may include optical couplers, such as waveguide tapers, and/or diffractive coupling elements, such as diffractive grating couplers, for transmitting and receiving signals at various optical ports of the silicon photonic chip 102. In one embodiment, the optical coupling elements 114 are integrated into the silicon photonic chip 102. In another embodiment, the optical coupling elements 114 are separate elements that may be coupled to the silicon photonic chip during manufacturing of the electro-optical assembly 100. Additionally, the silicon photonic chip 102 may include one or more electrical coupling elements 106a-106d for providing electrical signal input and output at the silicon photonic chip 102. The electrical coupling elements may include, but is not limited to, electrical wires, electrodes, pins, etc.

The electro-optical carrier (EO carrier) 104 is configured to transport electrical and optical signals to and from the silicon photonic chip 102. The EO carrier 104 may include optical waveguides 108 capable of routing optical signals in and out of optical ports of the silicon photonic chip 102. Optical couplers 116 may be integrated components of the waveguide 108 or may be separate optical elements that are assembled onto the waveguide during manufacture of the electro-optical assembly 100. The input and output ports of the silicon photonic chip 102 and the output of the waveguide 108 are generally aligned upon a bonding step of the manufacturing process such that an optical signal may be transmitted between the silicon photonic chip 102 and the waveguide 108 via optical coupling elements 114 and 116. The optical waveguides may further include optical couplers 112 for providing an optical signal communication with other optical components (not shown). In various embodiments, the exemplary optical waveguides 108 may be coupled to the electro-optical carrier 104 or integrated into the electro-optical carrier 104 as shown below in FIGS. 3 and 4. The EO carrier 104 may further include one or more electrical wires 125 configured to couple to the electrical coupling elements 106a-106d of the silicon photonic chip 102 and route electrical signals to and from the silicon photonic chip 102. Upon bonding of the silicon photonic chip 102 to the EO carrier 104, the optical coupling elements of the silicon photonic chip 102 are in an aligned position to allow for optical communication between the silicon photonic chip 102 and the EO carrier 104, and the electrical coupling elements 106a-106d of the silicon photonic chip 102 are aligned for electrical communication between the silicon photonic chip 102 and the EO carrier 104. In addition, the EO carrier 104 may include various electrical connectors 118 for providing an electrical connection other electrical devices.

The silicon photonic chip 102 and the EO carrier 104 may be electrically connected using standard methods, such as soldering. The silicon photonic chip 102 is electrically coupled to the EO carrier 104 via exemplary electrical connections 106a-106d. In one embodiment, the electrical connections 106a-106d also provides a mechanical coupling between the silicon photonic chip 102 and EO carrier 104.

The optical elements 114 may be an integrated component of the silicon photonic chip 102. Also, the optic elements 116 may be an integrated component of the waveguide 108 of the EO carrier 104. In various alternate embodiments, the optical elements 114 and 116 may be non-integrated components that are assembled to the silicon photonic chip 102 and the EO carrier 104, respectively. The optical elements 114 and 116 realize several functions including the collection, focus, expansion and deflection of optical beams carrying optical signals. Optical beam expansion may increase the mechanical alignment tolerance between the silicon photonic chip 102 and the EO carrier 104.

FIG. 2 shows a top view of the exemplary electro-optical assembly 100. The silicon photonic chip 102 is shown in a packaged position with respect to the EO carrier 104. The EO carrier 104 is shown having waveguides 108 at various locations along the EO carrier 104. Waveguides 108 provide optical communication along optical pathways. Thus, multiple optical elements are to be pre-aligned to each other prior to bonding the silicon photonic chip 102 to the EO carrier 104. In various aspects, pre-alignment refers to a rough alignment of the optical elements and/or electrical elements prior to a bonding step of the manufacturing process. In alternate embodiments, waveguides may also be used to provide optical communication to the silicon photonic chip 102 at edges 121 and 122 of the EO carrier 104. Thus, optical alignment of the silicon photonic chip 102 with the EO carrier 104 may include alignment for optical communication along more than one optical communication pathway and in more than one direction.

FIG. 3 shows an optical coupling between the silicon photonic chip 102 and the EO carrier 104 in an exemplary embodiment. The assembly of the silicon photonic chip 102 and the EO carrier 104 provides an in-plane coupling between the optical waveguide 108 of the EO carrier 104 and the silicon photonic chip 102. The exemplary optical waveguide 108 is coupled to a surface 120 of the EO carrier 104. Optical elements 114 are coupled to the silicon photonic chip 102 and optical elements 116 are coupled to the optical waveguide 108. The waveguide and the optical inputs and/or optical outputs of the silicon photonic chip 102 are configured to be at a substantially same height above the surface 120 when the silicon photonic chip 102 is bonded to the electro-optical carrier 104. In various embodiments, the optical elements 114 and 116 may include a micro-lens, a micro-lens linear array, a micro-mirror, an optical waveguide, etc. Thus, the optical connection between the silicon photonic chip 102 and the EO carrier 104 is substantially within a plane of the optical waveguide 108.

Figure 4:
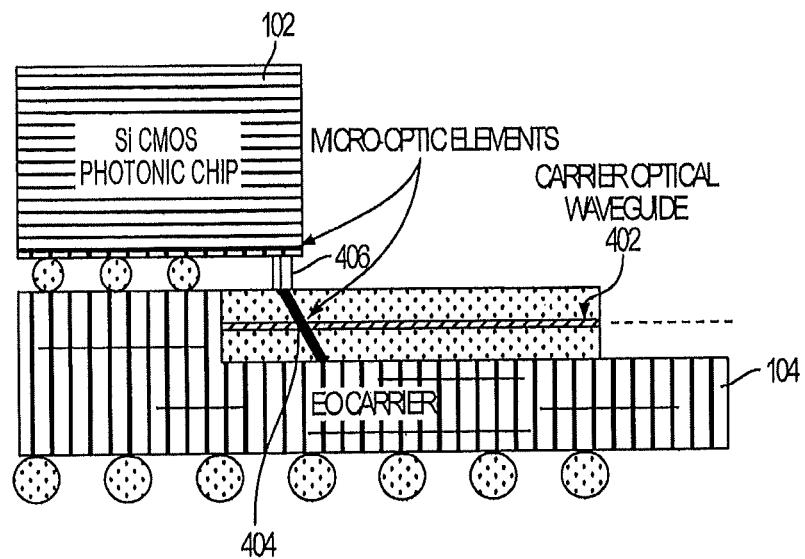
FIG. 4 shows an optical coupling between the silicon photonic chip and the electro-optical carrier in an alternate embodiment.

FIG. 4 shows an optical coupling between the silicon photonic chip 102 and the EO carrier 104 in an alternate embodiment. The assembly of the silicon photonic 102 and the EO carrier 104 provides an out-of-plane optical coupling. The carrier optical waveguide 402 is integrated into the electrical carrier portion of the EO carrier 104 so that the optical signals are transported within the plane of the EO carrier 104. Therefore, the optical communication pathway between the silicon photonic chip 102 and the EO carrier 104 is substantially out of the plane of the optical waveguide 402. In the exemplary embodiment, the optical connection is perpendicular to the plane of the optical waveguide 402. A mirror 404 diverts an optical beam 406 transmitted between the silicon photonic chip 102 and the EO carrier 104 for transmittal within the carrier optical waveguide 402.

Figure 5:
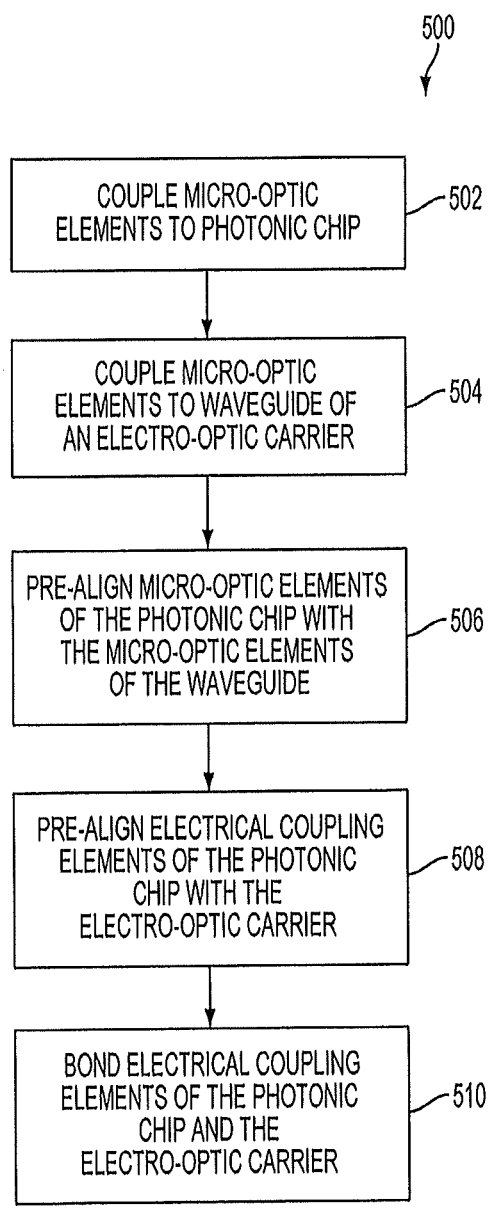
FIG. 5 shows a flowchart illustrating an exemplary method for assembling the electro-optical assembly disclosed herein.

FIG. 5 shows a flowchart illustrating an exemplary method for assembling the electro-optical assembly disclosed herein. In box 502, optical coupling elements (i.e., waveguide tapers, diffractive coupling elements, micro-lens, a micro-lens linear array, a micro-mirror, optical waveguide, etc.) are assembled onto optical inputs and optical outputs of the silicon photonic chip 102. Alternately, the optical coupling elements are integrated into the silicon photonic chip 102. In box 504, optical coupling elements are assembled onto an optical waveguide of the EO carrier 104. Alternately, the optical coupling element may be integrated into the waveguide. In box 506, the optical elements of the silicon photonic chip and of the waveguide of the EO carrier are pre-aligned for optical communication between the silicon photonic chip and EO carrier. In box 508, the electrical connections of the silicon photonic chip and the EO carrier are pre-aligned. In box 510, the electrical coupling elements of the silicon photonic chip and of the EO carrier are bonded. The electrical bonding of box 510 provides a final alignment of electrical coupling elements and optical coupling elements of the silicon photonic chip 102 and the EO carrier 104. Thus, the single bonding step of box 510 establishes an optical communication pathway and an electrical communication pathway.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A method of assembling an electro-optical device, comprising:
   positioning a first unit of the electro-optical device with respect to a second unit of the electro-optical device to pre-align an optical coupling element of the first unit and an optical coupling element of the second unit so that an optical waveguide of the second unit is aligned substantially in a plane of an optical port of the first unit;
   positioning the first unit with respect to the second unit to pre-align an electrical coupling element of the first unit with an electrical coupling element of the second unit; and
   bonding the electrical coupling element of the first unit directly to the electrical coupling element of the second unit to assemble the electro-optical device to form an electrical communication pathway of the electro-optical device, wherein the optical coupling element of the first unit and the optical coupling element of the second unit form an optical communication pathway of the electro-optical device when the electrical coupling elements are bonded to each other.

2. The method of claim 1, wherein at least one of the optical coupling elements is selected from the group consisting of: an optical emitter; an optical receiver; an optical waveguide; a micro-lens; a micro-mirror; a diffractive element; and a diffractive grating coupler.

3. The method of claim 1, wherein at least one of the optical coupling elements is one of: integrated into the first unit; coupled to the first unit; integrated into the second unit; and coupled to the second unit.

4. The method of claim 1, wherein positioning the first unit for electrical communication with the second unit further comprises aligning an electrical coupling element of the first unit with an electrical coupling element of the second unit.

5. The method of claim 4, wherein bonding the first unit to the second unit further comprises bonding the electrical coupling element of the first unit with the electrical coupling element of the second unit.

6. The method of claim 1, wherein at least one of the optical coupling elements broadens an optical beam to increase a mechanical positioning tolerance between the first unit and the second unit.

7. The method of claim 1, wherein the first unit further comprises a silicon photonic chip and the second unit further comprises an electro-optical carrier.

8. A method of assembling an electro-optical device, comprising:
   pre-aligning an optical coupling element of a silicon photonic chip with an optical coupling element of an electro-optical carrier so that an optical waveguide of the electro-optical carrier is aligned substantially in a plane of an optical port of the silicon photonic chip;
   pre-aligning an electrical coupling element of the silicon photonic chip with an electrical coupling element of the electro-optical carrier; and
   connecting the electrical coupling element of the silicon photonic chip directly to the electrical coupling element of the electro-optical carrier to assemble the electro-optical device to form an electrical communication pathway of the electro-optical device, wherein the optical coupling element of the silicon photonic chip and the optical coupling element of the electro-optical carrier form an optical communication pathway of the electro-optical device when the electrical coupling elements are connected to each other.

9. The method of claim 8, wherein at least one of the optical coupling elements is selected from the group consisting of: an optical emitter; an optical receiver; an optical waveguide; a micro-lens; a micro-mirror; a diffractive element; and a diffractive grating coupler.

10. The method of claim 8, wherein at least one of the optical coupling elements is one of: integrated into the silicon phonic chip; coupled to the silicon phonic chip; integrated into the electro-optic carrier; and coupled to the electro-optic carrier.

11. The method of claim 8, wherein at least one of the optical coupling elements broadens an optical beam to increase a mechanical positioning tolerance between the silicon phonic chip and the electro-optical carrier.

* * * * *